(12) United States Patent
Ju et al.

(10) Patent No.: US 6,579,590 B2
(45) Date of Patent: Jun. 17, 2003

(54) THERMALLY-ASSISTED MAGNETIC RECORDING DISK WITH MULTILAYERED THERMAL BARRIER

(75) Inventors: Yongho Ju, San Jose, CA (US); Wen Y. Lee, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 4 days.

(21) Appl. No.: 09/991,321

(22) Filed: Nov. 16, 2001

(65) Prior Publication Data

US 2003/0096077 A1 May 22, 2003

(51) Int. Cl.[7] .................................................. G11B 5/82
(52) U.S. Cl. ...................... 428/65.3; 428/336; 428/426; 428/457; 428/469; 428/422; 428/694 ST; 428/694 TS
(58) Field of Search ................................ 428/68.3, 336, 428/426, 457, 469, 472, 694 ST, 694 TS

(56) References Cited

U.S. PATENT DOCUMENTS

| | | | |
|---|---|---|---|
| 4,649,451 A | 3/1987 | Tomita | |
| 5,353,268 A | 10/1994 | Hintz et al. | |
| 5,583,727 A | 12/1996 | Parkin et al. | |
| 5,652,044 A | * 7/1997 | Rickerby | 428/216 |
| 5,687,679 A | 11/1997 | Mullin et al. | |
| 5,942,334 A | * 8/1999 | Wortman | 428/469 |
| 5,986,978 A | 11/1999 | Rottmayer et al. | |
| 5,998,003 A | 12/1999 | Courtright et al. | |

OTHER PUBLICATIONS

"Data Recording at Ultra High Density", IBM Technical Disclosure Bulletin, vol. 39, No. 7, Jul. 1996, p. 237.
"Thermally–Assisted Magnetic Recording", IBM Technical Disclosure Bulletin, vol. 40, No. 10, Oct. 1997, p. 65.
D. Josell et al., "Thermal Diffusion Through Multilayer Coatings: Theory and Experiment", International Journal of Thermophysics, vol. 19, No. 2, 1998, pp. 525–535.
E.–K. Kim et al., "Heat conduction in ZnS:SiO2 composite films", Physical Review B, vol. 61, No. 9, Mar. 1, 2000, pp. 6036–6040.

* cited by examiner

Primary Examiner—Steven A. Resan
(74) Attorney, Agent, or Firm—Thomas R. Berthold

(57) ABSTRACT

A magnetic recording disk for thermally-assisted magnetic recording has a low thermal conductivity multilayered thermal barrier between the substrate and the magnetic recording layer to avoid rapid heat conduction away from the locally heated spot and to reduce the amount of power needed to raise the temperature of the recording media above a required value. The barrier comprises a plurality of alternating layers or bilayers of a metal having an electrical resistivity greater than approximately 100 microOhm-cm and a dielectric selected from the group consisting of oxides, nitrides and oxynitrides of one or more of Al and Si. The large number of metal/dielectric interfaces, each with high thermal resistance, reduces the out-of-plane thermal conductivity of the barrier, and the use of high electrical resistivity metal layers minimizes in-plane heat spreading.

10 Claims, 3 Drawing Sheets

THERMALLY-ASSISTED MAGNETIC RECORDING DISK WITH MULTILAYERED THERMAL BARRIER

TECHNICAL FIELD

This invention relates to thermally-assisted magnetic recording (TAMR) where data is written while the magnetic recording layer is at an elevated temperature, and more particularly to a TAMR disk that has a multilayered thermal barrier located between the disk substrate and the magnetic recording layer.

BACKGROUND OF THE INVENTION

Magnetic recording disk drives store digital information by using a very small thin film inductive write head. The write head is patterned on the trailing surface of a slider that also has an air-bearing surface (ABS) to allow the slider to ride on a thin film of air above the surface of the rotating disk. The write head is an inductive head with a thin film electrical coil located between the poles of a magnetic yoke. When write current is applied to the coil, the pole tips provide a localized magnetic field across a gap that magnetizes the recording layer on the disk into one of two distinct magnetic states (binary data bits).

The magnetic material for use as the recording layer on the disk is chosen to have sufficient coercivity such that the magnetized data bits are written precisely and retain their magnetization state until written over by new data bits. The data bits are written in a sequence of magnetization states to store binary information in the drive and the recorded information is read back with a use of a read head that senses the stray magnetic fields generated from the recorded data bits. Magnetoresistive (MR) read heads include those based on anisotropic magnetoresistance (AMR), giant magnetoresistance (GMR), such as the spin-valve type of GMR head, and the more recently described magnetic tunnel junction (MTJ) effect. Both the write and read heads are kept in close proximity to the disk surface by the slider's ABS, which is designed so that the slider "flies" over the disk surface as the disk rotates beneath the slider.

Disk drive areal data density (the number of bits that can be recorded on a unit surface area of the disk) is now approaching the point where the data bits are so small they can be demagnetized simply from thermal agitation within the magnetized bit (the so-called "superparamagnetic" effect). The conventional approach to circumventing this problem is to increase the magneto-crystalline anisotropy and coercivity of the magnetic material in the recording layer on the disk to improve the thermal stability. However, this requires that the write head be made with a material with high saturation moment to increase the write field of the head so the head can write on the high coercivity media.

Since it is known that the coercivity of the magnetic (i.e., the magnetic recording layer on the disk) is temperature dependent, one proposed solution is thermally-assisted magnetic recording (TAMR), wherein the magnetic material in the media is heated locally to near or above its Curie temperature during writing so that the coercivity is low enough for writing to occur, but high enough for thermal stability of the recorded bits at ambient temperature. Several approaches to TAMR have been proposed, including use of a laser beam or ultraviolet lamp to do the localized heating, as described in "Data Recording at Ultra High Density", *IBM Technical Disclosure Bulletin*, Vol. 39, No. 7, July 1996, p. 237; "Thermally-Assisted Magnetic Recording", *IBM Technical Disclosure Bulletin*, Vol. 40, No. 10, October 1997, p. 65; and IBM's U.S. Pat. No. 5,583,727. A read/write head for use in a TAMR system is described in U.S. Pat. No. 5,986,978, wherein a special optical channel is fabricated adjacent to the pole or within the gap of a write head for directing laser light or heat down the channel. IBM's pending application Ser. No. 09/608,848 filed Jun. 29, 2000 describes a TAMR disk drive wherein the thin film inductive write head includes an electrically resistive heater located in the write gap between the pole tips of the write head for locally heating the magnetic recording layer.

In TAMR the magnetic recording media must be able to retain the heat from the heat source, whether a laser or resistive heater, so that the magnetic material in the locally heated spot can reach the required temperature and stay at that temperature for the required time. Thus the use of a low thermal conductivity material as a thermal barrier beneath the magnetic recording layer not only avoids rapid heat conduction away from the locally heated spot but also reduces the amount of power required at the heat source.

Multilayered thermal barriers are known as coatings for various components, such as turbine blades, as described in U.S. Pat. Nos. 5,687,699 and 5,998,003. These barriers typically comprise large numbers of bilayers or alternating layers of dissimilar dielectrics, such as alumina and zirconia, with each dielectric/dielectric interface acting as a phonon scattering zone. Multilayers of alternating dissimilar dielectrics are also known for regulating the reflection from a magneto-optic (M-O) recording layer, as described for up to five $ZnS/MgF_2$ bilayers in U.S. Pat. No. 4,649,451. D. Josell et al., in "Thermal Diffusion Through Multilayer Coatings: Theory and Experiment", *International Journal of Thermophysics*, Vol. 19, No. 2, 1998, pp. 525–535, studied a thermal barrier of multiple bilayers of molybdenum/alumina, where each layer was greater than 1000 Angstrom, and concluded there was no difference in thermal conductivity from comparable metal/metal multilayers.

What is needed is TAMR disk with an effective low-conductivity thermal barrier beneath the magnetic recording layer.

SUMMARY OF THE INVENTION

The invention is a TAMR disk that has a low thermal conductivity multilayered thermal barrier between the substrate and the magnetic recording layer to avoid rapid heat conduction away from the locally heated spot and to reduce the amount of power needed to raise the temperature of the recording media above a required value. The barrier comprises a plurality of alternating layers or bilayers of a metal having a high electrical resistivity, preferably greater than approximately 100 microOhm-cm, and a dielectric selected from the group consisting of oxides, nitrides and oxynitrides of one or more of Al and Si. The large number of metal/dielectric interfaces, each with high thermal resistance, reduces the out-of-plane thermal conductivity of the barrier, and the use of high electrical resistivity metal layers minimizes in-plane heat spreading.

For a fuller understanding of the nature and advantages of the present invention, reference should be made to the following detailed description taken together with the accompanying figures.

DETAILED DESCRIPTION OF THE INVENTION

Figure 1:
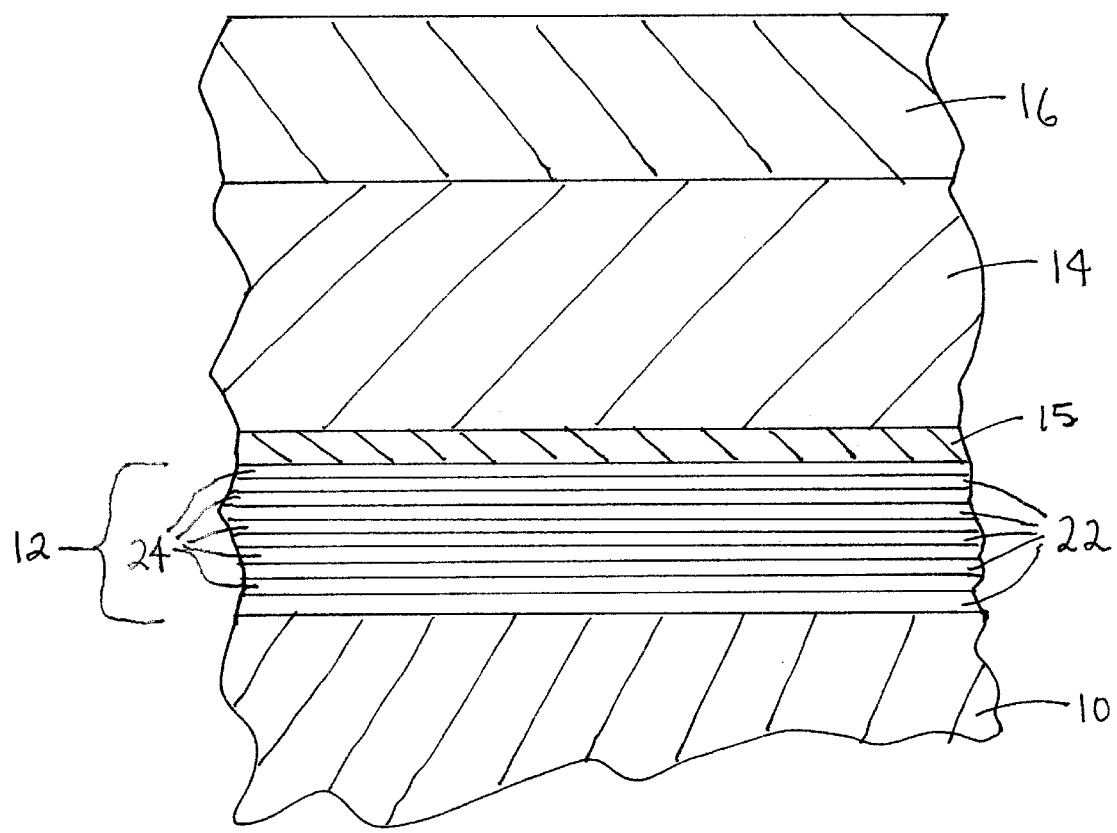
FIG. 1 is a sectional view of a TAMR disk of the present invention illustrating the multilayered metal/dielectric thermal barrier between the disk substrate and the magnetic recording layer.

FIG. 1 shows a sectional view of the TAMR disk of the present invention. The disk comprises a substrate 10, a multilayered metal/dielectric barrier 12 on the substrate 10, a magnetic recording layer 14 on the barrier 12, an optional seed layer 15 for the magnetic recording layer 14 between the barrier 12 and magnetic recording layer 14, and a protective overcoat 16.

The substrate 10, seed layer 15, magnetic recording layer 14, and overcoat 16 are well known in the art and thus their composition and fabrication processes will not be described in detail. The disk substrate 10 is typically glass. The magnetic recording layer may be conventional longitudinal or horizontal media, such as CoCrPt or similar Co alloys, or perpendicular media, such as Co—Pt multilayers. The overcoat 16 is typically formed of diamond-like amorphous carbon or nitrogenated carbon. An underlayer (not shown in FIG. 1) of a soft magnetic material, such as permalloy, may be used beneath the barrier 12 as a magnetic flux return path if the magnetic recording layer 14 is perpendicular media. The layers are deposited on the substrate 10 by conventional thin film deposition techniques, such as RF or DC magnetron sputtering.

For glass substrates without a thermal barrier, it has been estimated that heat flux in excess of $10^{10}$ W/m$^2$ is needed to locally raise the temperature of the recording medium by approximately 200° K over an area of 50 nm×50 nm, which is what would be required for TAMR at areal densities of 1 Tbits/in$^2$ and above. There is at present no practical heat source that can reliably deliver such heat flux to such a small spot.

The present invention describes a multilayered thermal barrier beneath the magnetic recording layer that exploits thermal resistance at interfaces between metallic and insulating layers of thickness of the order of 10 Angstrom. The individual layers of the thermal barrier, when taken independently, have thermal conductivity comparable to or greater than that of known thermal barriers. However, large thermal resistance at metal-insulator interfaces, as opposed to metal-metal or insulator-insulator interfaces, dramatically reduces the overall thermal conductivity of the multilayered barrier. The present barrier can achieve thermal conductivity values that are several times smaller than that of highly disordered oxide, nitride, or sulfide composite layers commonly used as thermal barriers, such as ZnS:SiO2 composite layers (ZnS nanoparticles dispersed in a SiO2 matrix) used in M-O disks.

The thermal barrier 12 comprises multiple bilayers or alternating layers of a dielectric layer 22 formed of oxides or nitrides of one or more of Al and Si ($SiO_x$, $SiN_x$, $SiO_xN_y$, $AlO_x$, $AlN_x$, $AlO_xN_y$, $AlSiO_x$, $AlSi_xN_y$, $AlSi_xO_yN_z$, etc.) and a metal layer 24, the metal having a high electrical resistivity, preferably greater than 100 microOhm-cm. Such metals include the beta phase of Ta, as well as Nb, Hf, Y and Zr. The dielectrics and metals are also selected to have atomic vibrational properties, as can be measured, for example, in terms of the Debye temperature, very different from one another. For example, the Debye temperature is 240° K for bulk Ta and 1048° K for bulk alumina ($Al_2O_3$). Each layer in the barrier can be deposited using RF or DC magnetron or ion beam sputtering, or other suitable thin film deposition techniques. To facilitate integration to conventional magnetic recording disk manufacturing processes, RF magnetron sputtering for the dielectric layers and DC magnetron sputtering for the metal layers are the preferred methods of preparation. Each of the layers 22, 24 is of the order of a few tens of Angstrom thick, preferably in the range of 5–100 Angstrom. The high electrical resistivity of the metal layers 24 is directly related to low thermal conductivity, but is more easily measurable. The low conductivity of the metal layers 24 minimizes in-plane heat spreading, which is important to prevent heating the adjacent data tracks. The dielectric layers 22 have the advantage that they can be grown as ultra-thin continuous films.

The out-of-plane thermal conductivity of beta-Ta (50 Angstrom)/$AlSi_xN_y$ (20 Angstrom) multilayers was measured to be 0.25 W/m° K. This is consistent with the calculated out-of-plane thermal conductivity of 0.06 W/m° K for a multilayer of beta-Ta (10 Angstrom)/$AlSi_xN_y$ (10 Angstrom). By comparison, the out-of-plane thermal conductivity of a ZnS:SiO2 composite film used in M-O disks is approximately 0.5 W/m° K.

Figure 2:
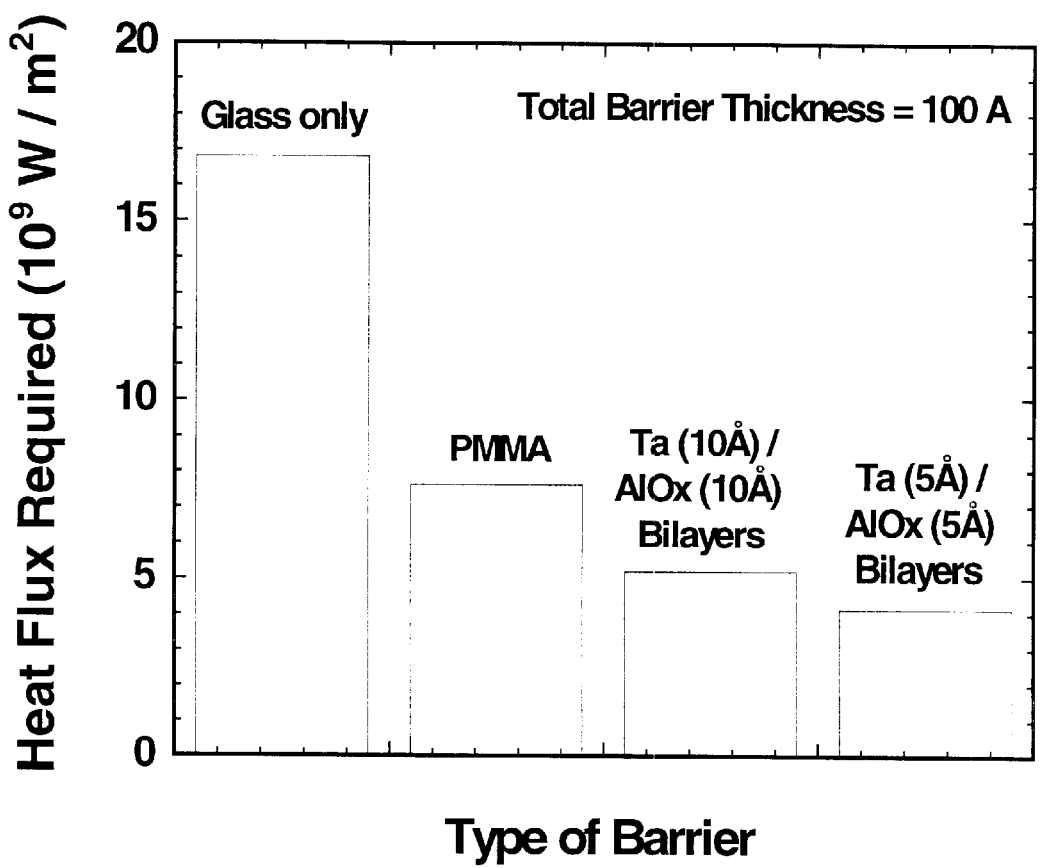
FIG. 2 is a bar chart comparing the amount of required heat flux for glass substrate TAMR disks with no thermal barrier, with a polymer thermal barrier and with two different multilayered thermal barriers of the present invention.
Figure 3:
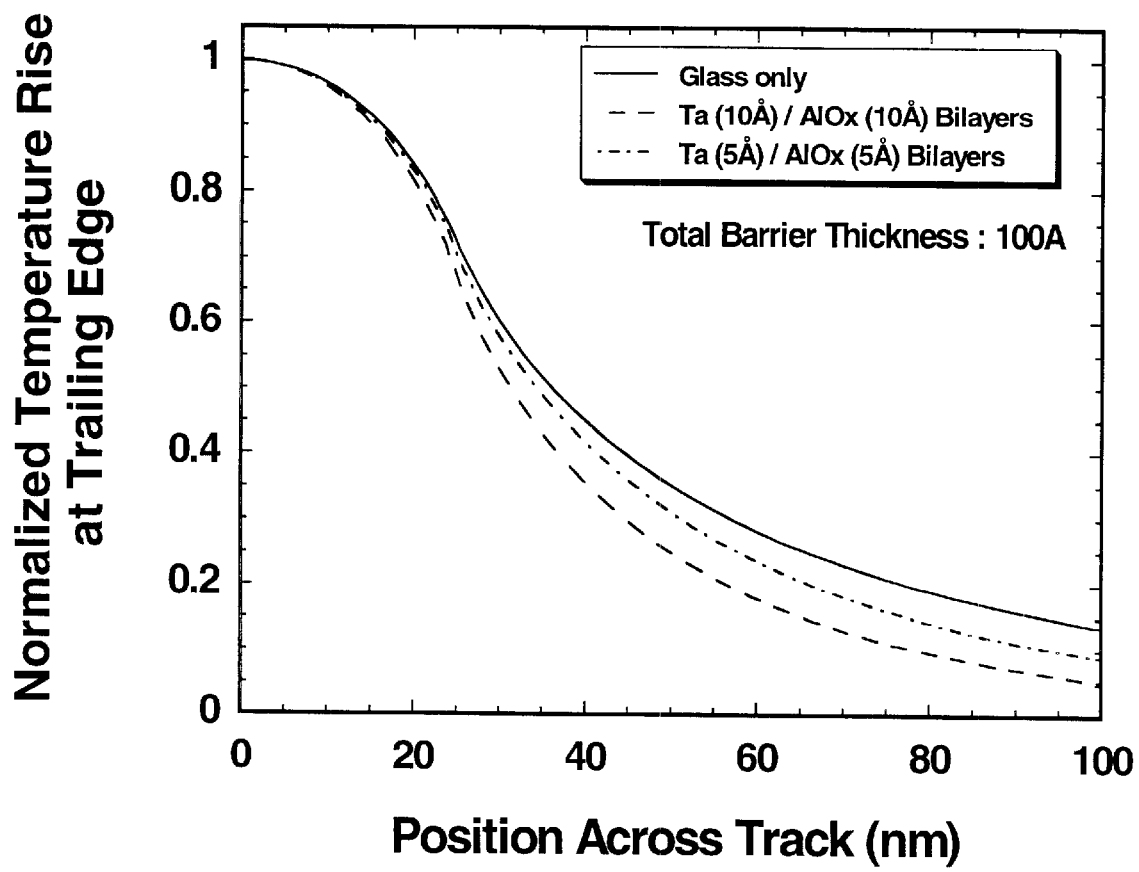
FIG. 3 is a comparison of temperature rise across (perpendicular to) the data track for glass substrate TAMR disks with no thermal barrier and with two different multilayered thermal barriers of the present invention.

FIGS. 2 and 3 illustrate the benefits of the multilayered thermal barrier in a TAMR disk, based on theoretical calculations. The disk substrate was assumed to be glass and the magnetic recording layer was assumed to be a 50 Angstrom granular thin film of a high coercivity material, such as a FePt alloy with perpendicular magneto-crystalline anisotropy, deposited on a suitable seed layer (e.g., MgO). A soft magnetic underlayer of 2000 Angstrom thick permalloy (the well-known easily magnetizable and demagnetizable NiFe alloy with a composition of approximately 80% Ni and 20% Fe) was assumed to be located on the glass substrate below the thermal barrier. The disk was assumed to move at a linear velocity of 10 m/s, and the size of the heat spot was assumed to be 50 nm×50 nm square (500 Angstrom×500 Angstrom).

FIG. 2 shows the amount of heat flux required to raise the temperature of the recording layer at the trailing edge of the heat spot to greater than 200° K for glass substrate disks without a thermal barrier, with a poly (methyl methacrylate) (PMMA) barrier, and with two types of multilayered barriers according to the present invention. Each of the three barriers had a total thickness of 100 Angstrom. A multilayered barrier consisting of 5 bilayers of beta-Ta/$AlSi_xN_y$, each layer 10 Angstrom, resulted in a required heat flux of approximately $5 \times 10^9$ W/m$^2$, as compared to $8 \times 10^9$ W/m$^2$ for the PMMA barrier and $17 \times 10^9$ W/m$^2$ for a disk with no barrier. A multilayered barrier consisting of 10 bilayers of beta-Ta/$AlSi_xN_y$, each layer 5 Angstrom (twice as many metal/dielectric interfaces as the other multilayered barrier), resulted in an even lower required heat flux of only $4 \times 10^9$ W/m$^2$.

FIG. 3 shows the normalized temperature rise across track for the same two types of multilayered thermal barriers compared to that for a glass substrate with no barrier, with a temperature level of 1 indicating the temperature at the trailing edge of the heat spot. The disks with the multilayered thermal barriers according to the present invention both showed less in-plane heat spreading, which is possible because of the use of the high-resistivity metal layers. High resistivity in metals is directly related to low thermal conductivity but is more easily measurable. It is believed that for TAMR the metals used as the metal layers in the multilayered thermal barrier of the present invention should have an electrical resistivity of greater than 100 microOhm-cm. Beta-Ta has an electrical resistivity of approximately 200 microOhm-cm.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A thermally-assisted magnetic recording disk comprising:
   a substrate;
   a magnetic recording layer on the substrate; and
   a multilayered thermal barrier between the substrate and the recording layer, the barrier comprising alternating layers of a metal having an electrical resistivity greater than approximately 100 microOhm-cm and a dielectric selected from the group consisting of oxides, nitrides and oxynitrides of one or more of Al and Si, the barrier having a plurality of metal layers and a plurality of dielectric layers.

2. The disk of claim 1 wherein the metal in the metal layers is selected from the group consisting of the beta phase of Ta, Nb, Hf, Y and Zr.

3. The disk of claim 2 wherein the metal in the metal layers is the beta phase of Ta.

4. The disk of claim 1 wherein the thickness of each of the layers in the barrier is between 5 and 100 Angstrom.

5. The disk of claim 1 further comprising a seed layer between the thermal barrier and the recording layer.

6. The disk of claim 1 further comprising an underlayer between the substrate and the thermal barrier.

7. The disk of claim 6 wherein the recording layer comprises a layer of perpendicular magnetic recording material and the undertaker comprises a layer of soft magnetic material.

8. The disk of claim 1 further comprising a protective overcoat on the recording layer.

9. The disk of claim 1 wherein the substrate is glass.

10. A thermally-assisted magnetic recording disk comprising:
    a substrate;
    a magnetic recording layer on the substrate; and
    a multilayered thermal barrier between the substrate and the recording layer, the barrier comprising at least five bilayers, each bilayer consisting of a layer of a dielectric selected from the group consisting of oxides, nitrides and oxynitrides of one or more of Al and Si, and a layer of beta-Ta, the dielectric layer and beta-Ta layer each having a thickness between 5 and 100 Angstrom and being in contact to define an interface.

* * * * *